United States Patent

Chiba et al.

Patent Number: 5,329,229
Date of Patent: Jul. 12, 1994

[54] MAGNETIC FIELD DETECTION COILS WITH SUPERCONDUCTING WIRING PATTERN ON FLEXIBLE FILM

[75] Inventors: Norio Chiba; Satoru Yabe; Akikazu Odawara; Satoshi Nakayama, all of Tokyo, Japan

[73] Assignee: Seiko Instruments Inc., Japan

[21] Appl. No.: 914,894

[22] Filed: Jul. 15, 1992

[30] Foreign Application Priority Data

Jul. 25, 1991 [JP]  Japan .................................. 3-186495
Jun. 17, 1992 [JP]  Japan .................................. 4-157764

[51] Int. Cl.$^5$ ................ G01R 33/035; G01R 33/022; H01F 5/08; H01F 27/28
[52] U.S. Cl. .................................. 324/248; 29/602.1; 336/200; 505/846; 505/880; 324/258
[58] Field of Search ............... 324/244, 248, 258, 260, 324/262; 336/200, 206, DIG. 1; 29/599, 602.1, 605; 505/845, 846, 880

[56] References Cited

U.S. PATENT DOCUMENTS

| | | | |
|---|---|---|---|
| 3,726,004 | 4/1973 | Holland et al. | 336/200 X |
| 4,320,341 | 3/1982 | Lutes | 324/248 |
| 4,639,708 | 1/1987 | Weatherly | 336/200 |
| 4,693,000 | 9/1987 | Hoenig | 324/248 X |
| 5,049,818 | 9/1991 | Dossel et al. | 324/248 |

FOREIGN PATENT DOCUMENTS 0185186  6/1986  European Pat. Off. .

OTHER PUBLICATIONS

Journal of Applied Physics, vol. 42, No. 10, Sep. 1971, N.Y., N.Y., pp. 3682–3684, A. Rosen et al., "Magnetic Records of the Heart's Electrical Activity with a Cryogenic Magnetometer".
Applied Physics Letters, vol. 55, No. 14, Oct. 2, 1989, N.Y., N.Y., pp. 1451–1453, V. Foglietti et al., "Performance of dc SQUIDs with resistively shunted inductance".

Primary Examiner—Gerard R. Strecker
Attorney, Agent, or Firm—Bruce L. Adams; Van C. Wilks

[57] ABSTRACT

Superconducting detection coils for a superconducting quantum interference device are foraged on a flexible printed wiring film having a pair of opposed edges. The flexible printed wiring film is capable of being shaped into a cylinder by bringing the opposed edges toward each other. A superconducting wiring pattern is formed on the flexible printed wiring film and has at least one substantially U-shaped wiring portion. The U-shaped wiring portion forms at least two circular wiring patterns when the printed wiring film is shaped into a cylinder by bringing the opposed edges toward each other. The superconducting wiring pattern also has a first and a second electrode portion for connecting the circular wiring patterns to at least one superconducting quantum interference device. A resistor is electrically connected between the electrode portions of the superconducting wiring pattern.

10 Claims, 3 Drawing Sheets

MAGNETIC FIELD DETECTION COILS WITH SUPERCONDUCTING WIRING PATTERN ON FLEXIBLE FILM

BACKGROUND OF THE INVENTION

The present invention relates to the structure of detection coils used in a magnetic sensor employing superconducting quantum interference devices (SQUIDs) which are applied to high-sensitivity magnetic sensors.

SQUIDs have been heretofore applied to detection of weak magnetic fields. Bobbin-shaped detection coils composed of superconducting wires are often used in SQUID fluxmeters.

FIG. 10 shows conventional first-derivative detection coils of the bobbin type. Shown are a bobbin 11, a superconducting coil wire 12, electrodes 13, and a damping resistor 14. The superconducting coil wire 12 is so arranged in a groove formed in the bobbin 11 that upper and lower coils are wound in opposite senses. The superconducting coil wire 12 is connected with the electrodes 13 which are connected with the damping resistor 14.

FIG. 11 shows the structure of conventional second-derivative detection coils of the bobbin type. Upper and lower coils are wound in the same sense. An intermediate coil is wound in the opposite sense with twice as many turns as the number of turns of the upper and lower coils. The wires of the first-derivative and second-derivative detection coils of the bobbin type are strands except for the circular portion of the coils so that magnetic flux is prevented from intersecting the wires. The first-derivative detection coil of the bobbin type detects the difference between the magnetic field signal detected by the upper coil and the magnetic field signal detected by the lower coil, i.e., the magnetic gradient is detected. The second-derivative detection coil of the bobbin type detects the difference between the magnetic field gradient detected by the upper and intermediate coils and the magnetic field gradient detected by the intermediate and lower coils. Therefore, the accuracy of the areas of the coils, the shape accuracy, the accuracy of the positional relation between them, the accuracy of the degree of the parallelism between them, and other factors affect the magnetic gradient sensitivity.

In the above-described conventional first-derivative detection coils of the bobbin type, the groove in the bobbin which accommodates the superconducting coil wire is required to be machined with high accuracy. Also, when the superconducting coil wire is laid, a triangular gap is formed at the boundary between each circular coil portion and strand. This makes it difficult to improve the accuracy of the areas of the coils, the shape accuracy, the accuracy of the positional relation between them, and the accuracy of the degree of the parallelism between them. As a result, the magnetic field gradient sensitivity and the reproducibility of the characteristics are deteriorated. Furthermore, the coils are difficult to manufacture, because high skill is needed for the manufacture. In addition, when the damping resistor is connected in parallel with the detection coils, it is difficult to connect the resistor directly to the detection coils. Therefore, the resistor has been connected close to the locations in which the coils are connected with the SQUID. Hence, the efficiency of the conventional devices has been low.

SUMMARY OF THE INVENTION

It is an object of the present invention to provide first or higher order-derivative bobbin-type superconducting detection coils for a magnetic sensor or the like having improved dimensional accuracy.

To acheive the foregoing object, the present invention offers superconducting detection coils comprising a flexible printed wiring film on which a superconducting wiring pattern is formed and which is capable of being bent into a cylinder. A resistor may or may not be formed on the film. The superconducting wiring pattern has a substantially U-shaped wiring portion formed in a portion thereof. The U-shaped wiring portion forms cylindrical wiring patterns when the flexible printed wiring film is shaped into a cylinder by bringing opposed edges of the film toward each other.

In the superconducting detection coil structure described above, the detection coil wiring pattern and the pattern of the resistor can be fabricated by ordinary printed wiring film conductive pattern fabrication techniques. The flexible film is merely bent into a cylinder. In this way, the superconducting detection coils can be easily fabricated. Consequently, the accuracy of the areas of the upper and lower coils, the shape accuracy, the accuracy of the positional relation between them, and the accuracy of the degree of parallelism between them can be improved. Furthermore, the absolute accuracy of the resistance value and the absolute accuracy between the plural superconducting detection coils can be improved.

DETAILED DESCRIPTION OF THE PREFERRED EMBODIMENTS

The present invention is next described in detail with reference to its embodiment.

Figure 1:
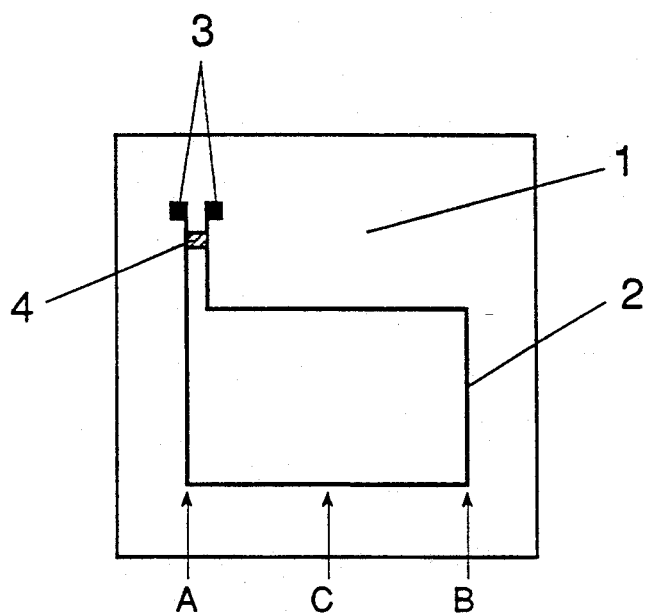
FIG. 1 shows the wiring pattern on a flexible printed wiring film for first-derivative bobbin-type detection coils, showing example 1 of the present invention.

FIG. 1 shows the pattern of wiring on a flexible printed wiring film for a first-derivative detection coil of the bobbin type, thus showing example 1 of the present invention. Shown components are the flexible printed wiring film 1, a superconducting wiring pattern 2, electrodes 3, a resistive interconnect 4. The flexible printed wiring film 1 consists of polyimide. The superconducting wiring pattern 2 and the electrodes 3 are fabricated by plating of lead-tin (Pb-Sn), sputtering of niobium (Nb), or deposition of lead-indium (Pb-In). Other wiring of a superconducting thin or thick film may also be used as the pattern 2 or as the electrodes 3. A buffer layer for the film of the Pb-Sn plating is used and consists of a resistive material such as copper (Cu) or palladium (Pd). Other high-resistivity materials can also be employed. The resistive interconnect 4 is made of a resistive material similar to the material used for the buffer layer for the Pb-Sn plating film.

Figure 3:
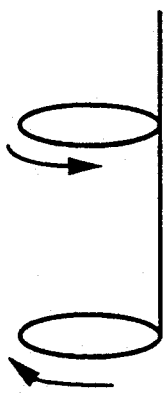
FIG. 3 shows the structure of first-derivative bobbin-type detection coils of one turn.
Figure 4:
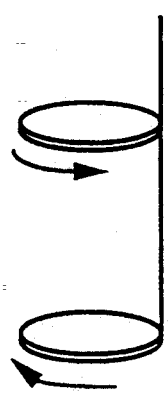
FIG. 4 shows the structure of first-derivative bobbin-type detection coils of two turns.

The flexible printed wiring film is bent such that the portion indicated by A in FIG. 1 and the portion indicated by B overlap each other. In this way, first-derivative detection coils of one turn of the structure shown in FIG. 3 can be fabricated. The arrows of FIG. 3 indicate the directions of winding of the coils. Also, first-derivative detection coils of two turns of the structure shown in FIG. 4 can be fabricated by bending the flexible printed wiring film two turns such that the portions A, C, and B of FIG. 1 overlap each other. The arrows of FIG. 4 indicate the directions of winding of the coils.

Figure 2:
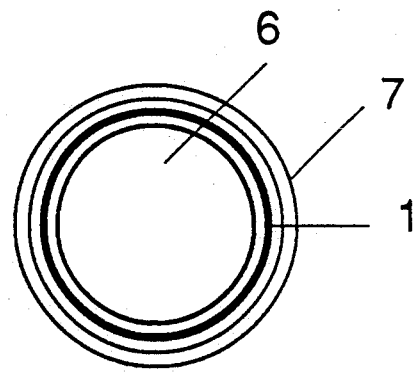
FIG. 2 is a cross-sectional view showing the structure of the first-derivative bobbin-type detection coils, showing example 1 of the present invention.

FIG. 2 is a cross-sectional view showing the structure of the first-derivative bobbin-type detection coils, showing example 1 of the present invention. Shown are a bobbin 6 and a cover 7. The flexible printed wiring film 1 on which the superconducting wiring pattern shown in FIG. 1 is formed is wound around the bobbin 6. The cylindrical cover 7 is disposed over the wound flexible printed wiring film. The bobbin 6 which may be a solid or hollow cylinder is made of FRP, glass, Teflon, or other material. The cover 7 that is cylindrical in shape is made of FRP, glass, Teflon, or other material. As shown in FIG. 1, the superconducting wiring pattern 2 has a generally U-shaped portion comprised of two leg portions interconnected by a base portion. The opposed ends of each leg portion are brought into overlapping relation (FIGS. 2–4) to form a circular wiring pattern when the printed wiring film 1 is formed into a cylinder shape.

Figure 5:
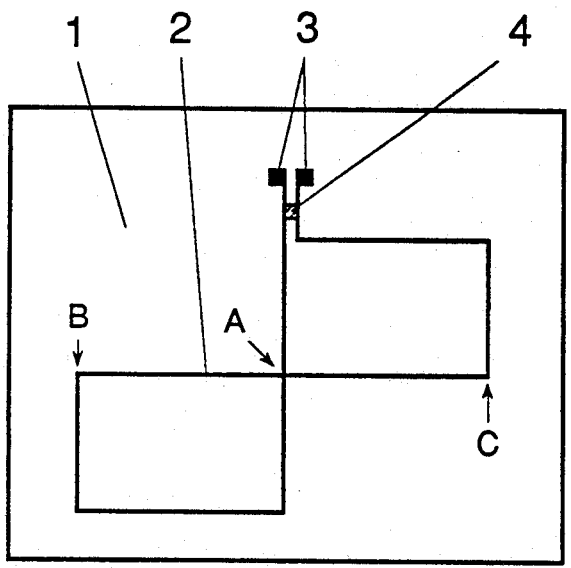
FIG. 5 shows the wiring pattern on a flexible wiring printed film for first-derivative bobbin-type detection coils, showing example 2 of the present invention.

FIG. 5 shows the wiring pattern on a flexible printed wiring film 1 for second-derivative bobbin-type detection coils, showing example 2 of the present invention. The flexible printed wiring film 1, the superconducting wiring pattern 2, the buffer layer for the Pb-Sn plating film, the electrodes 3, and the resistive interconnect 4 are made of the same materials as those of the counterparts of example 1. Electrical conduction is prevented at the intersection of wires indicated by A in FIG. 5. For example, after fabricating the lower superconducting film wiring, it is covered with an insulating material such as urethane and then the upper superconducting film wiring is fabricated at the intersection area.

Figure 6:
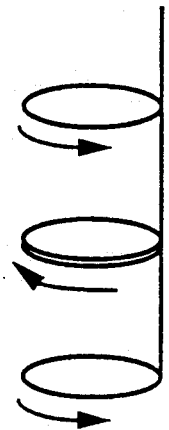
FIG. 6 shows the structure of second-derivative bobbin-type detection coils comprising an upper coil of one turn, an intermediate detection coil of two turns, and a lower detection coil of one turn.

Second-derivative detection coils having one upper turn, two intermediate turns, and one lower turn, respectively, as shown in FIG. 6 can be fabricated by winding the device two turns such that the portions A, B and C of FIG. 5 overlap each other. The arrows of FIG. 6 indicate the directions of winding of the coils. Also, second-derivative detection coils having two upper turns, four intermediate turns, and two lower turns, respectively, as shown in FIG. 5 can be fabricated by winding the device four turns such that the portions A, B, and C of FIG. 5 overlap each other.

Figure 7:
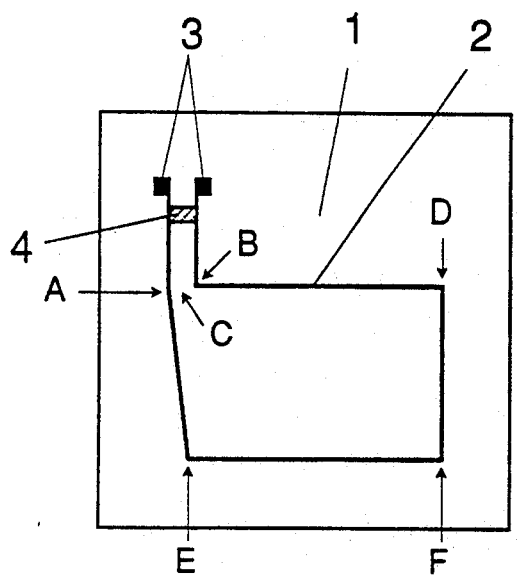
FIG. 7 shows the wiring pattern on a flexible printed wiring film for first-derivative bobbin-type detection coils, showing example 3 of the present invention.

FIG. 7 shows the wiring pattern on a flexible printed wiring film for first-derivative bobbin-type detection coils, showing example 3 of the present invention. In FIG. 7, the wire portions B-D and E-F are equal in length. The flexible printed wiring film 1, the superconducting wiring pattern 2, the buffer layer for the Pb-Sn plating film, the electrodes 3, and the resistive interconnect 4 are made of the same materials as those of the counterparts of example 1. The superconducting wiring pattern 2 has a U-shaped portion B-D-F-E which is formed into a pair of detection coils when the flexible printed wiring film 1 is shaped into a cylinder by bringing opposed edges toward each other. First-derivative detection coils of one turn and two turns, respectively, can be fabricated by bending the flexible film in one turn and two turns, respectively, such that D is placed on the position C located midway between A and B of FIG. 7.

The area of the upper coil can be made exactly coincident with the area of the lower coil of the finished detection coils by laying the wire portion A-E of the superconducting wiring pattern 2 of FIG. 7 at an angle such that the wire portions B-D and E-F agree in length. Stated otherwise, the legs B-D and E-F of the substantially U-shaped portion B-D-F-E are of equal length. Noise produced laterally of the detection coils can be reduced by bending the flexible film in such a way that the center of the wire portion D-F is placed on the center of the wire portion A-E of FIG. 7.

Figure 8:
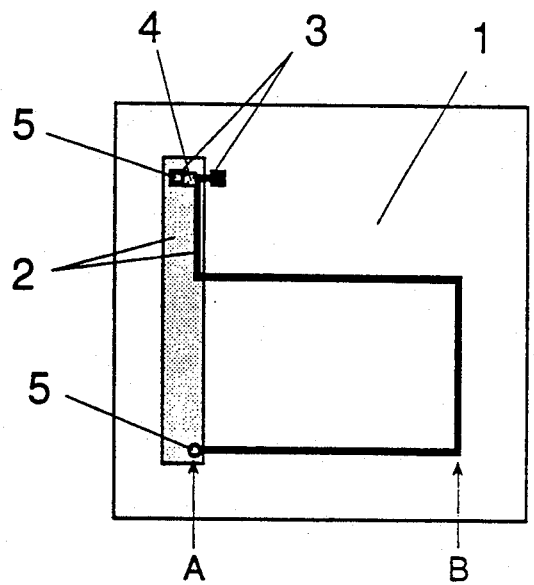
FIG. 8 shows the wiring pattern on a flexible printed wiring film for first-derivative bobbin-type detection coils showing example 4 of the present invention.

FIG. 8 shows the wiring pattern on a flexible printed wiring film for first-derivative bobbin-type detection coils, showing example 4 of the present invention. The flexible printed wiring film 1, the superconducting wiring pattern 2, the buffer layer for the Pb-Sn plating film, the electrodes 3, and the resistive interconnect 4 are made of the same materials as those of the counterparts of example 1. The superconducting wiring pattern 2 is formed on both surfaces of the flexible printed wiring film 1 or on different layers. Electrical conduction between the portions formed on both surfaces of the flexible printed wiring film 1 or on the different layers is permitted by superconductors passed through contact holes 5 formed in the buffer layer and in the flexible printed wiring film 1. First-derivative detection coils of one turn and two turns, respectively, are fabricated by bending the flexible film one turn and two turns, respectively, such that portion B is placed on portion A of FIG. 8.

Figure 9:
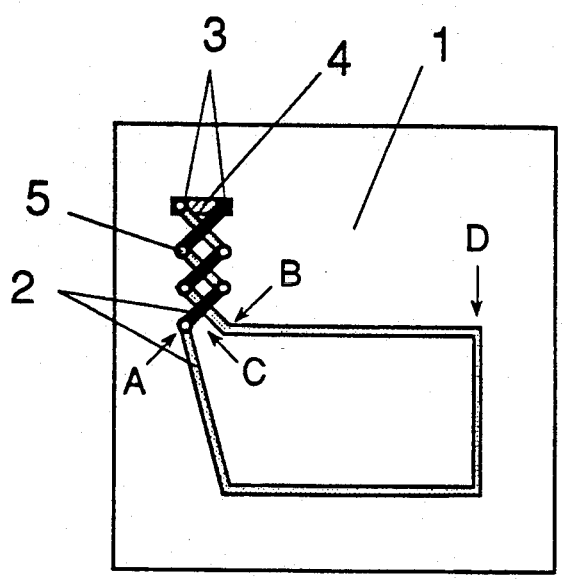
FIG. 9 shows the wiring pattern on a flexible printed wiring film for first-derivative bobbin-type detection coils, showing example 5 of the present invention.
Figure 10:
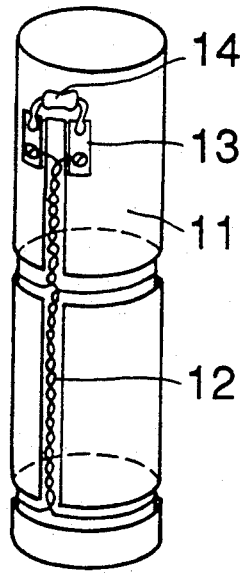
FIG. 10 shows the structure of conventional first-derivative bobbin-type detection coils.
Figure 11:
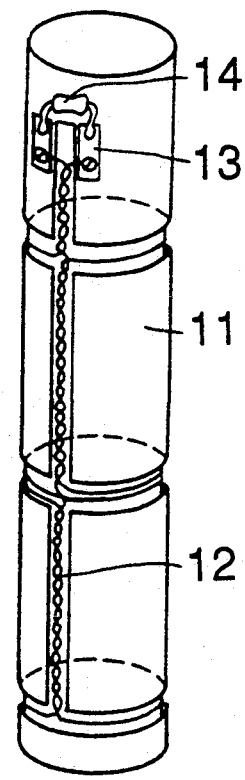
FIG. 11 shows the structure of conventional second-derivative bobbin-type detection coils.

FIG. 9 shows the wiring pattern on a flexible printed wiring film of first-derivative bobbin-type detection coils, showing example 5 of the present invention. The flexible wiring printed film 1, the superconducting wiring pattern 2, the buffer layer for the Pb-Sn plating film, the electrodes 3, and the resistive interconnect 4 are made of the same materials as those of the counterparts of example 1. The superconducting wiring pattern 2 is formed on both surfaces of the flexible printed film 1 or on different layers in the same way as in example 4.

As shown in FIG. 9, the wires of the superconducting wiring pattern extend from the electrodes 3 between portions A and B to the front and rear surfaces or to different layers of the flexible printed wiring film 1 in a staggered relation to each other to remove lateral noise caused by external magnetic disturbance. First-derivative detection coils of one turn and two turns, respectively, are fabricated by bending the flexible film one turn and two turns, respectively, such that portion D is placed on position C located midway between portions A and B of FIG. 9.

In the above-described structure of the superconducting detection coils, first- or higher order-derivative superconducting detection coils of any desired turns can be fabricated by shaping a flexible printed wiring film having a coil wiring pattern into a cylinder. The accuracy of the circular areas of the coils, the shape accuracy, the accuracy of the positional relation between them, and the accuracy of the degree of the parallelism between them can be extremely improved. Furthermore, the absolute accuracy of the damping resistor and the relative accuracy between plural superconducting detection coils can be improved. Thus, the magnetic filed gradient sensitivity and the reproducibility of the magnetic characteristics can be enhanced.

As described thus far, in accordance with the present invention, superconducting detection coils can be easily fabricated by shaping a flexible printed wiring film having superconducting film wiring and a resistive interconnect into a cylinder. The accuracy of the circular areas of the upper and lower coils, the shape accuracy, the accuracy of the positional relation between them, and the accuracy of the degree of the parallelism between them can be extremely improved. Further, the absolute accuracy of the damping resistor and the relative accuracy between plural superconducting detection coils can be improved. Thus, the magnetic field gradient sensitivity and the reproducibility of the magnetic characteristics can be enhanced.

What is claimed is:

1. Superconducting detection coils for a superconducting quantum interference device, comprising: a flexible printed wiring film capable of being shaped into a cylinder; a superconducting wiring pattern formed on the flexible printed wiring film and having a generally U-shaped wiring portion for forming at least a pair of upper and lower circular wiring patterns when the flexible printed wiring film is shaped into a cylinder, the generally U-shaped wiring portion having two leg portions interconnected by a base portion, each leg portion having opposed ends which are brought into overlapping relation to form a circular wiring pattern when the printed wiring film is formed into a cylinder shape; and electrode patterns connected to the substantially U-shaped wiring pattern for coupling the circular wiring patterns to at least one superconducting quantum interference device.

2. Superconducting detection coils according to claim 1, further comprising a resistor electrically connected in parallel with the superconducting wiring pattern.

3. Superconducting detection coils for a superconducting quantum interference device, comprising: a flexible printed wiring film having a pair of opposed edges and capable of being flexed into a cylinder shape by bringing the opposed edges toward each other; and a superconducting wiring pattern formed on the flexible printed wiring film and having at least one generally U-shaped wiring portion for forming at least two circular wiring patterns when the printed wiring film is formed into a cylinder shape by bringing the opposed edges toward each other, the generally U-shaped wiring portion having two leg portions interconnected by a base portion, each leg portion having opposed ends which are brought into overlapping relation to form a circular wiring pattern when the printed wiring film is formed into a cylinder shape, the superconducting wiring pattern having a first electrode portion and a second electrode portion for connecting the circular wiring patterns to at least one superconducting quantum interference device.

4. Superconducting detection coils according to claim 3; further comprising a resistor electrically connected between the first electrode portion and the second electrode portion.

5. Superconducting detection coils according to claim 3; wherein the superconducting wiring pattern has at least two generally U-shaped wiring portions for forming at least three circular wiring patterns when the printed wiring film is formed into a cylinder shape.

6. Superconducting detection coils according to claim 3; wherein the two leg portions are of equal length so that an area of a circular wiring pattern formed by one leg portion is the same as an area of a circular wiring pattern formed by the other leg portion when the printed wiring film is formed into a cylinder shape.

7. Superconducting detection coils according to claim 3; wherein the printed wiring film has a front surface and a back surface, and has at least one through-hole between the back surface and the front surface; and the superconducting wiring pattern is formed on both the front surface and the back surface and electrically connected through the at least one through-hole.

8. Superconducting detection coils according to claim 7; wherein the two leg portions are formed on one of the front surface and the back surface, one leg portion being connected to a portion of the superconducting wiring pattern formed on the other of the front surface and the back surface through the at least one through-hole.

9. Superconducting detection coils according to claim 7; wherein the two leg portions are formed on one of the front surface and the back surface; and the superconducting wiring pattern includes a first connecting portion formed on both the front surface and the back surface and connected through at least one through-hole and a second connecting portion formed on both the front surface and the back surface and connected through at least one through-hole, the first and second connecting portions overlapping each other with the flexible printed wiring film between them, and the first connecting portion being connected between the first electrode and one leg portion and the second connecting portion being connected between the second electrode and the other leg portion so that the overlapping first and second connecting portions effectively remove noise caused by external magnetic disturbance.

10. Superconducting detection coils according to claim 3; wherein the two leg portions are parallel and the base portion is perpendicular to the two leg portions.

* * * * *